US005702005A

United States Patent [19]
Pakerisamy et al.

[11] Patent Number: 5,702,005
[45] Date of Patent: Dec. 30, 1997

[54] PLLC/LCC TUBE

[75] Inventors: Saragavani Pakerisamy, San Jose; Wayne H. Tan, Los Gatos, both of Calif.

[73] Assignee: Advanced Micro Devices, Inc., Sunnyvale, Calif.

[21] Appl. No.: 614,755

[22] Filed: Mar. 13, 1996

[51] Int. Cl.⁶ .................................................. B65D 73/02
[52] U.S. Cl. ........................................ 206/718; 206/713
[58] Field of Search .................................. 206/701, 713, 206/718; 361/212, 220

[56] References Cited

U.S. PATENT DOCUMENTS

| | | | |
|---|---|---|---|
| 4,327,832 | 5/1982 | de Matteo | 206/718 |
| 4,592,481 | 6/1986 | Chen | 206/718 |
| 4,690,274 | 9/1987 | Lue | 206/718 |
| 4,711,350 | 12/1987 | Yen | 206/718 |
| 4,721,206 | 1/1988 | Votter | 206/718 |
| 5,011,012 | 4/1991 | Kattleman | 206/718 |
| 5,242,051 | 9/1993 | Murphy | 206/718 |
| 5,435,446 | 7/1995 | Hosseinmardi et al. | 206/713 |
| 5,524,766 | 6/1996 | Marchek et al. | 206/701 |

Primary Examiner—David T. Fidei
Attorney, Agent, or Firm—Davis Chin

[57] ABSTRACT

A PLCC/LCC container for storing and shipping of PLCC/LCC packages in a side-by-side arrangement includes a tubular body member (24), a first end plug member (26a), and a second end plug member (26b). The tubular body member has a first end and a second end. The tubular body member has a bore of a rectangular cross-section extending therethrough between the first end and the second end. The tubular body member includes an upper wall section (34), a lower wall section (36), and a pair of opposed side walls (38,40) all integrally connected together. There are provided end portions (48, 50) formed on the lower wall section for supporting only small portions of the top surface adjacent to the side edges of the PLCC/LCC packages so that top and bottom surfaces thereof are substantially suspended freely between offset intermediate portions on the respective upper and lower wall sections of the tubular member. As a result, triboelectric charge and removal of anti-static coating will be minimized due to less contact between the package surfaces and the interior surfaces of the tubular member.

6 Claims, 2 Drawing Sheets

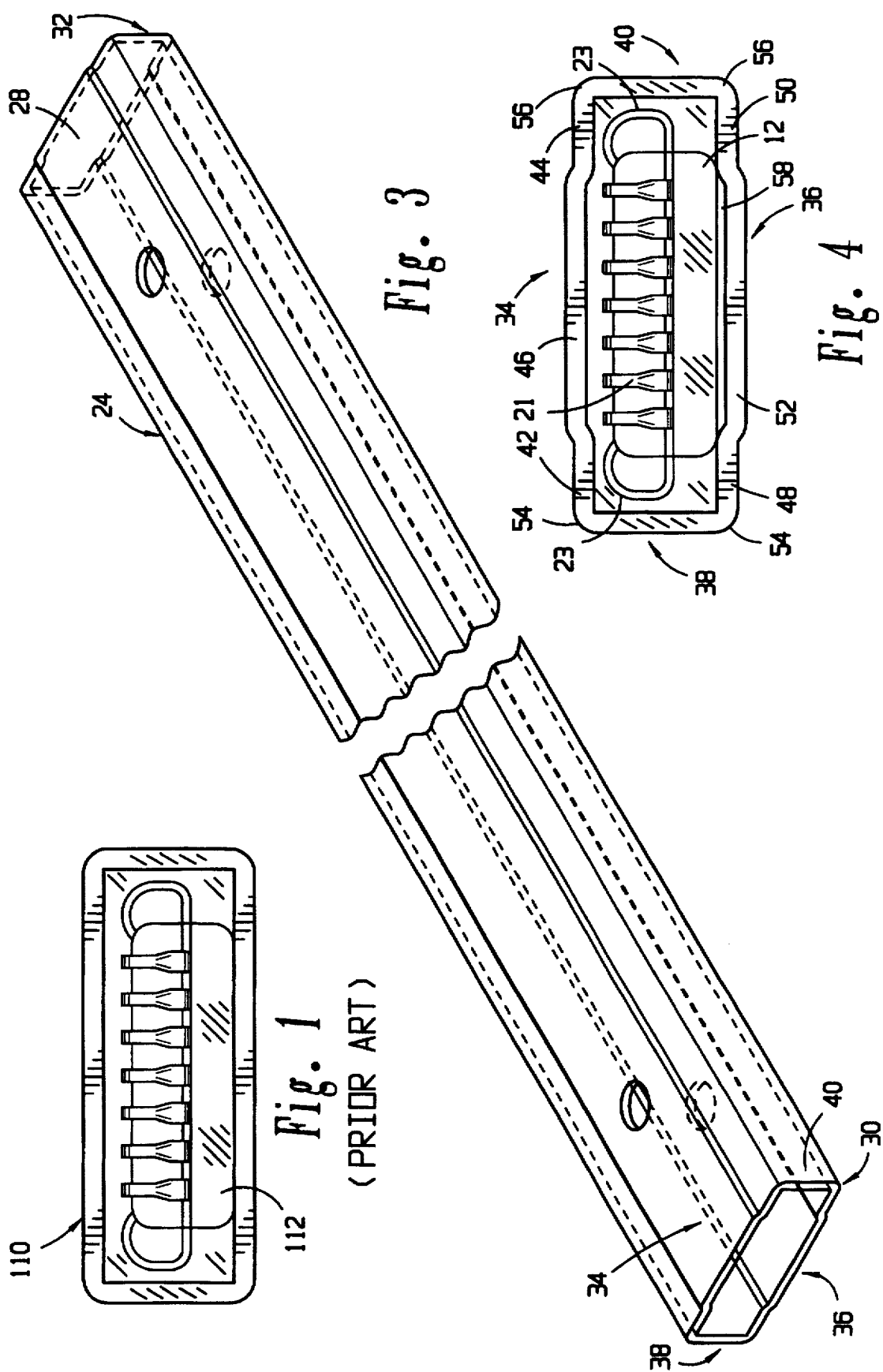

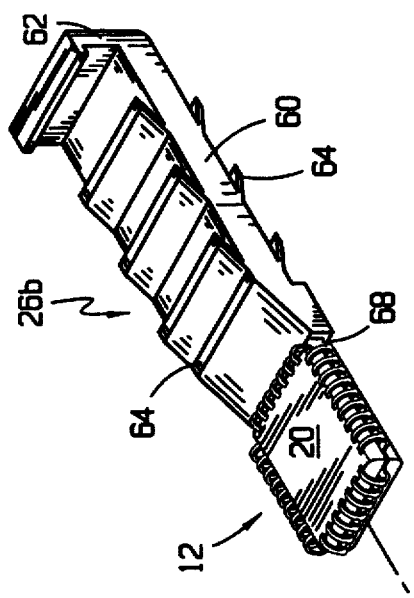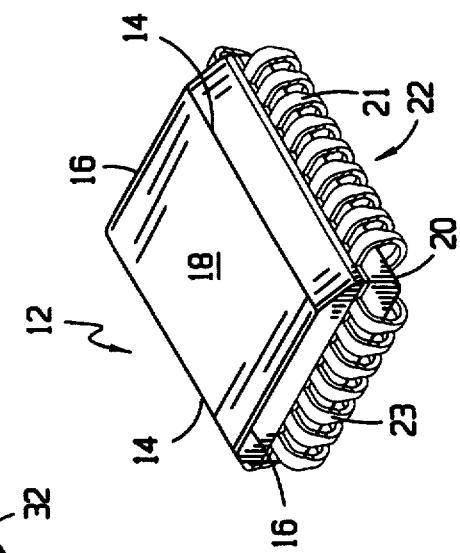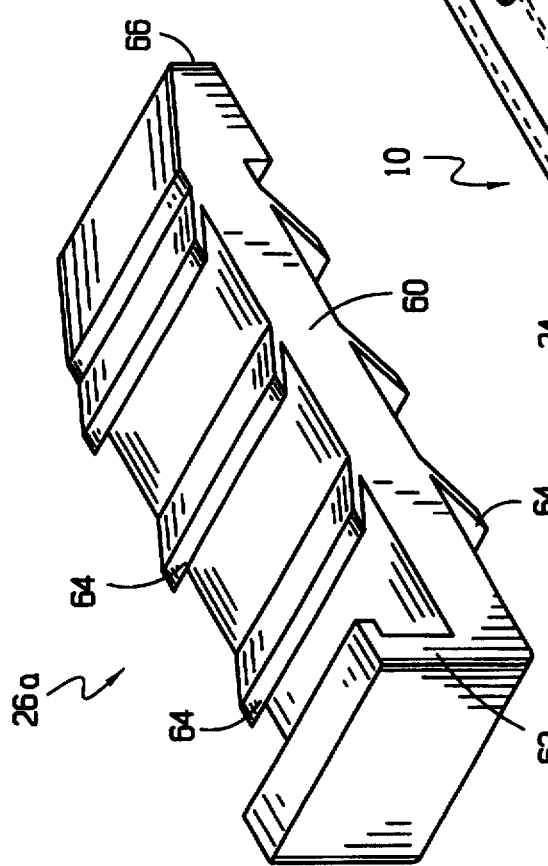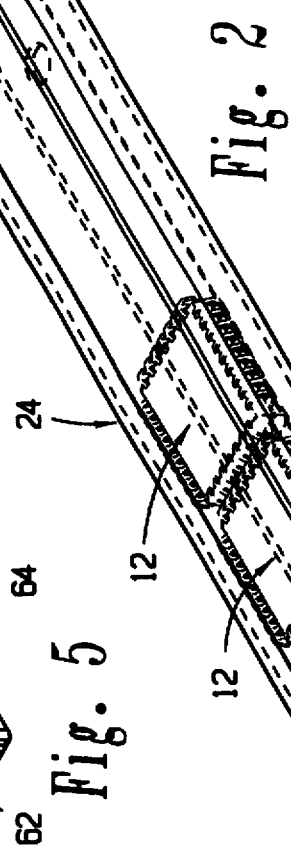

PLLC/LCC TUBE

BACKGROUND OF THE INVENTION

This invention relates generally to packing devices and more particularly, it relates to a chip carrier tube of a unique configuration for storing and shipping a plurality of plastic leaded chip carrier (PLCC) packages or leadless chip carrier (LCC) packages in a side-by-side arrangement.

While integrated circuits have been conventionally heretofore housed in flat packs or dual in-line package (DIP) structures, these DIP structures have become unsuitable as high density packaging of circuit functions formed on a single integrated circuit semiconductor chip increases. In view of the trend for higher and higher packing densities for the semiconductor chips, there has been developed in recent years in the industry extremely small-sized rectangularly-shaped packages of the types referred to as plastic leaded chip carrier (PLCC) packages and leadless chip carrier (LCC) packages. Typically, these PLCC or LCC packages have dimensions of the four sides which are varying in width and length. This is because the package size is dependent upon the number of terminal leads on the PLCC packages or bond pads on the LCC packages which may be varied, i.e., 20 to 84. For instance, a PLCC or LCC package having 32 terminal leads (pads) may have dimensions of approximately 23.0 mm (in length)×20.0 mm (in width)×2.13 mm (in height).

Therefore, there has arisen a need for chip carrier tubes or containers for housing and/or shipping a relatively large number of these PLCC/LCC packages from a chip manufacturer's plant to an end-user's location. Since a number of chip carrier packages are generally placed laterally within the container adjacent to each other without separation during shipment, these chip carrier packages are susceptible to possible physical damage or even destruction during such handling and subsequent shipment. Further, the chip carrier tubes must also be capable of providing a degree of protection for the sensitive chip carrier packages to be transported therein with respect to contamination, triboelectric charge caused by contact between the chip carrier package surface and the tube surface, electrostatic discharge (ESD), variations in temperature, and mechanical vibration or shock.

There is known in the prior art of a chip carrier tube, as shown in FIG. 1, which is used for storing and shipping a plurality of PLCC/LCC packages. However, this prior art chip carrier tube suffers from the disadvantage of producing too much contact between the chip carrier package surface and the tube surface, thereby causing increased friction to occur. As a result, there will be an increase in the triboelectric charge and the anti-static coating applied on the tube surface may be removed.

In U.S. Pat. No. 5,435,446 to M. Hosseinmardi et al. issued on Jul. 25, 1995, and assigned to the same assignee as the present invention, there is disclosed a BGA carrier for storing and shipping of BGA packages in a side-by-side arrangement, which is hereby incorporated in its entirety by reference. The BGA carrier is also adapted for dispensing of the BGA packages in a one-by-one fashion under gravity. The BGA carrier includes a flat elongated tubular body member, a lower end plug member, and an upper end plug member. The tubular body member has a first end and a second end. The tubular body member has a bore of a rectangular cross-section extending therethrough between the first end and the second end. The tubular body member includes a flat top wall portion, a flat bottom wall portion, and a pair of vertically extending side walls all formed integrally together. Opposed overhanging slots are formed in the pair of vertically extending side walls for supporting only two side edges of a plurality of BGA packages so that the top and bottom surfaces thereof are suspended freely between the top and bottom wall portions of the tubular body member.

The present invention represents a significant improvement over the prior art tube of FIG. 1 and is similar to the BGA carrier of the '446 patent, but is of a novel construction for storing and shipping PLCC/LCC packages in a side-by-side arrangement.

SUMMARY OF THE INVENTION

Accordingly, it is a general object of the present invention to provide an improved PLCC/LCC container of a tubular construction which is relatively simple and economical to manufacture and assemble, but yet overcomes the disadvantages of the prior art tubes.

It is an object of the present invention to provide an improved chip carrier tube of a unique construction for storing and shipping PLCC or LCC packages in a side-by-side arrangement so as to protect the same from damage or possible destruction during handling and shipment.

It is another object of the present invention to provide an improved chip carrier tube for storing and shipping of a plurality of PLCC/LCC packages so as to produce less contact with the package surfaces, thereby reducing friction and minimizing the build-up of tribo-electric charge between the tube surfaces and the package surfaces.

It is still another object of the present invention to provide an improved PLCC/LCC container for storing and shipping of PLCC/LCC packages which includes upper and lower wall sections each having a first flat end portion, a second flat end portion, and an offset intermediate portion.

It is yet still another object of the present invention to provide an improved PLCC/LCC container which is made of a relatively inexpensive material and is of a simple construction, but is relatively durable and is reusable.

In a preferred embodiment of the present invention, there is provided a chip carrier container for storing and shipping of a plurality of PLCC/LCC packages in a side-by-side arrangement which includes a tubular body member, a first end plug member, and a second end plug member. The tubular body member has a first end and a second end. The tubular body member also includes a bore of a substantially rectangular cross-section extending therethrough between the first end and the second end. The tubular body member is formed of an upper wall section, a lower wall section, and a pair of opposed side walls all integrally connected together. The first end plug member is disposed slidably and frictionally into the bore adjacent the first end of the tubular body member. A plurality of PLCC/LCC packages are disposed upside down in the bore of the tubular body member to substantially fill the same. Each of the PLCC/LCC packages is of a substantially rectangular shape and has side edges, end edges, a top surface, and a bottom surface. The side and end edges are provided with terminal leads.

The upper wall section includes a first flat end portion, a second flat end portion, and an offset intermediate portion sandwiched between the first and second end portions. Similarly, the lower wall section has a first flat end portion, a second flat end portion, and an offset intermediate portion sandwiched between the first and second end portions. The first and second end portions on the lower wall section are used to support only small portions of the top surface adjacent to the side edges of the plurality of PLCC/LCC packages so that the top and bottom surfaces thereof are substantially suspended freely between the offset intermediate portions on the upper and lower wall sections of the tubular member. The second end plug member is disposed slidably and frictionally into the bore adjacent the second end of the tubular body member. As a result, shock and potential physical damage to the PLCC/LCC packages during commercial handling and shipping have been substantially reduced.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a cross-sectional view of a chip carrier tube of the prior art;

FIG. 2 is an exploded, perspective view of a PLCC/LCC container, constructed in accordance with the principles of the present invention;

FIG. 3 is a perspective view, similar to FIG. 2, except with the end plug members and PLCC/LCC packages being removed;

FIG. 4 is a cross-sectional view, taken along the lines 4—4 of FIG. 2;

FIG. 5 is an enlarged, perspective view of one of the plug members of FIG. 2; and FIG. 6 is an enlarged, perspective view of a PLCC package.

DESCRIPTION OF THE PREFERRED EMBODIMENT

Referring now in detail to the drawings, there is shown in FIGS. 2 through 4 a PLCC/LCC tube or container designated generally by reference numeral 10 and constructed in accordance with the principles of the present invention. The PLCC/LCC container 10 is used to store and ship a plurality of plastic leaded chip carrier (PLCC) packages 12 or leadless chip carrier packages (not shown) in a side-by-side arrangement. Each of the PLCC packages 12 (one of which is illustrated in detail in FIG. 6) is of a substantially rectangular configuration having opposed side edges 14, opposed end edges 16, a top surface 18, and a bottom surface 20. The side and end edges 14, 16 are provided with a plurality of terminal leads 22 which extend outwardly therefrom and to the bottom surface 20. For the PLCC package having 32 terminal leads as illustrated, there are provided nine terminal leads 21 on each side edge 14 and seven terminal leads 23 on each end edge 16.

The PLCC container 10 is comprised of a tubular body member 24 and a pair of end plug members 26a, 26b. The tubular body member 24 has a bore 28 of a substantially rectangular cross-section extending therethrough between a first end 30 and a second end 32. The tubular body member is of a unitary construction and is formed of a suitable plastic film material such as polyvinyl chloride, polycarbonate, polyethylene, or the like which may be extruded and vacuum or pressure formed to the desired shape. The plastic material is preferably treated or coated with an appropriate additive so as to render it anti-static or static-dissapitive as required. While the body member may be of various dimensions, the opposed side walls thereof are designed to be spaced apart so as to conform to the contour of the PLCC/LCC packages and the length is such that a predetermined quantity of the PLCC/LCC packages can be stored or housed therein. For example, the body member is typically made long enough so as to store thirty PLCC/LCC packages.

The body member further includes an upper wall section 34, a lower wall section 36, and a pair of opposed side walls 38, 40 all integrally connected together. As is illustrated in the preferred embodiment, the upper and lower wall sections 34 and 36 are disposed parallel to each other and extend longitudinally between the first and second ends 30, 32. Each of the upper and lower wall sections 34, 36 has a length of approximately 508 mm. The upper wall section 34 includes a first flat end portion 42, a second flat end portion 44, and an offset intermediate portion 46 sandwiched between the first and second end portions 42, 44. Similarly, the lower wall section 36 includes a first flat end portion 48, a second flat end portion 50, and an offset intermediate portion 52 sandwiched between the first and second end portions 48, 50. The first and second end portions 42, 44 (48,50) of the upper and lower wall sections 34, 36 have a dimension of about 2.79 mm. The offset intermediate portions 46 and 48 have a dimension of about 8.60 mm. The opposite first end portions 42 and 48 are spaced from each other by a distance of approximately 3.81 mm. The opposite second end portions 44 and 50 are also spaced apart by a distance of approximately 3.81 mm. The opposite offset intermediate portions 46 and 52 are spaced apart from each other by a distance of about 5.58 mm.

The opposed side walls 38 and 40 are spaced apart from each other by a distance of approximately 14.22 mm. The side wall 38 is joined to the opposite first end portions 42 and 48 by radii 54. Similarly, the side wall 40 is joined integrally to the opposite second end portions 44 and 50 by radii 56. The thickness of the upper wall section 34, lower wall section 36, and side walls 38, 40 is approximately 0.635 mm.

As will be noted from the prior art tube of FIG. 1, when the PLCC packages 112 are placed upside down within the tubular member 110 the internal surface of the bottom wall is in physical contact or engagement with the entire top surface of the package. As a result, this will create friction between the internal surface of the tubular member and the package surface so as to cause the build-up of triboelectric charge. Further, there exists the possibility of physical damage to the sensitive parts of the PLCC package due to the scraping off or removal of the anti-static coating applied to the interior surfaces of the tubular member.

Unlike the prior art tubular member of FIG. 1, when the PLCC packages 12 are disposed upside down in a side-by-side arrangement within the present tubular body member 24 of FIG. 4 only small portions of the top surface 18 adjacent to the side edges 14 of the PLCC package 12 are in physical contact or engageable with the internal surfaces of the first and second end portions 48, 50 of the lower wall section 36 of the tubular member. Consequently, there is less physical contact between the internal tubular body member surfaces and the package surface, thereby reducing friction therebetween. This serves to minimize the build-up of triboelectric charge and the removal of the anti-static coating. It will be appreciated that the terminal leads 23 on the end edges 16 are suspended freely below the offset intermediate portion 46 on the upper wall portion 34. Thus, these terminal leads 23 do not contact or engage with any part of the tubular body member 24. In addition, it can be seen that a gap 58 is created between the top surface 18 of the PLCC package 12 and the internal surface of the offset intermediate portion 52 on the lower wall section 36.

With reference now to FIG. 5, there is depicted an enlarged, perspective view of one of the first and second end plug members 26a, 26b of FIG. 2. Since the plug members 26a and 26b are identical in their construction and operation, it will be sufficient to describe in detail only one of them. The plug member 26a has a substantially L-shaped cross-section and is formed of an elongated horizontal portion 60 and a upwardly-extending tab portion 62 joined integrally to the horizontal portion 60. Each of the opposite sides of the horizontal portion 60 is provided with a plurality of radially extending fin-like projections or tips 64 which elastically engages the internal surfaces of the offset intermediate portions 46, 52 of the respective upper and lower wall sections. The projections or tips 64 on the plug member serve to maintain a firm physical contact with the internal surfaces of the tubular body member so as to prevent disengagement due to their own weight. In order to facilitate the opening of the container 10 and to permit the subsequent removal of the PLCC packages by the end users, the tab portion 62 serves as a gripping means so as to permit the pulling of the plug member away from the first and second ends of the tubular member. Each of the end plug members 26a, 26b is preferably fabricated from an elastomeric material such as rubber or other polymeric material.

In use, the elongated horizontal portion 60 of the first end plug member 26a is initially inserted into the bore 28 at the first end of the tubular body member 24. Then, pressure is applied to the tab portion 62 so as to cause the horizontal portion 60 with its projections 64 to slide frictionally into the bore. A predetermined number of PLCC/LCC packages 12 is then loaded upside down into the tubular body member 24 so as to completely fill the same, except for a small space adjacent its second end 32. It will be noted that the distal end 66 of the horizontal portion 60 of the first end plug 26a contacts or engages only the end edge 16 of the lowermost PLCC/LCC package 12. Next, the second end plug member 26b is inserted into the bore 28 at the second end 32 of the tubular body member 24 so that the distal end 68 of the horizontal portion 60 thereof contacts or engages only the side edge 16 of the uppermost PLCC/LCC package. In this manner, the tubular body member is closed by the first and second end plug members 26a, 26b so as to hold the PLCC/LCC packages 12 immovable therein against undesirable free movement. Thus, shock and potential physical damage to the PLCC/LCC packages 12 will be substantially reduced during commercial handling and shipment.

From the foregoing detailed description, it can thus be seen that the present invention provides an improved PLCC/LCC container of a unique construction for storing and shipping of PLCC/LCC packages in a side-by-side arrangement so as to protect the same from damage or possible destruction during handling and shipment. The PLCC/LCC container of the present invention includes means for supporting only small portions of the top surface adjacent to the side edges of the PLCC/LCC package so that its top and bottom surfaces are substantially suspended freely between offset intermediate portions on respective upper and lower wall sections of a tubular body member.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A PLCC/LCC container for storing and shipping of a plurality of PLCC/LCC packages in a side-by-side arrangement, said PLCC/LCC container comprising:

a tubular body member (24) having a first end and a second end;

said tubular body member having a bore of a substantially rectangular cross-section extending therethrough between said first end and said second end;

said tubular body member including an upper wall section (34), a lower wall section (36), and a pair of opposed side walls (38,40) all integrally connected together;

a first end plug member (26a) disposed slidably and frictionally into the bore adjacent said first end of said tubular body member;

a plurality of PLCC/LCC packages (12) disposed upside down in the bore of said tubular body member to substantially fill the same, each of said PLCC/LCC packages being of a substantially rectangular shape and having opposed side edges, opposed end edges, a top surface, and a bottom surface, said side and end edges being formed with a plurality of terminal means;

said upper wall section having a first flat end portion (42), a second flat end portion (44), and an offset intermediate portion (46) sandwiched between said first and second end portions;

said lower wall section having a first flat end portion (48), a second flat end portion (50), and an offset intermediate portion (52) sandwiched between said first and second end portions;

said first and second end portions (48,50) on said lower wall section (36) supporting only small portion of said top surface adjacent to said side edges (16) of said plurality of PLCC/LCC packages so that the top and bottom surfaces (18,20) thereof are substantially suspended freely between said offset intermediate portions (46,52) on said respective upper and lower wall sections (34,36) of said tubular body member;

said top surface of said plurality of PLCC/LCC packages having an intermediate area which is suspended above the interior surface of said offset intermediate portion (52) on said lower wall portion (36) of said tubular member so as to create a gap (58) therebetween;

a second end plug member (26b) disposed slidably and frictionally into the bore adjacent said second end of said tubular body member;

each of said first and second end plug members being formed of a substantially L-shaped cross-section and including an elongated horizontal portion (60) and a upwardly-extending tab portion (62) joined integrally to said horizontal portion; and the opposite sides of said horizontal portions of said plug members being provided with radially extending fin-like projections (64) which elastically engage the interior surfaces of the bore of said tubular body member.

2. A PLCC/LCC container as claimed in claim 1, wherein said tubular body member is formed of a plastic film material.

3. A PLCC/LCC container as claimed in claim 1, wherein said tubular body member is formed of polyvinyl chloride.

4. A PLCC/LCC container as claimed in claim 1, wherein each of said first and second end plug members is formed of an elastomeric material.

5. A PLCC/LCC container as claimed in claim 1, wherein said horizontal portion of said first plug member has a distal end (66) which engages one of the side edges of the lowermost PLCC/LCC package.

6. A PLCC/LCC container as claimed in claim 5, wherein said vertical portion of said second plug member has a distal end (68) which engages one of the end edges of the uppermost PLCC/LCC package.

* * * * *